US012592289B2

(12) United States Patent
He et al.

(10) Patent No.: US 12,592,289 B2
(45) Date of Patent: Mar. 31, 2026

(54) USAGE-BASED DISTURBANCE MITIGATION COUNTER CONTROL

(71) Applicant: Micron Technology, Inc., Boise, ID (US)

(72) Inventors: Yuan He, Boise, ID (US); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 18/635,946

(22) Filed: Apr. 15, 2024

(65) Prior Publication Data

US 2024/0371449 A1     Nov. 7, 2024

Related U.S. Application Data

(60) Provisional application No. 63/500,123, filed on May 4, 2023.

(51) Int. Cl.
G11C 16/34     (2006.01)

(52) U.S. Cl.
CPC ................................ G11C 16/3427 (2013.01)

(58) Field of Classification Search
CPC ........ G11C 16/3427; G11C 2029/0409; G11C 2029/1202; G11C 7/02; G11C 8/08; G11C 11/4085; G11C 16/08; G11C 29/025; G11C 29/20
See application file for complete search history.

(56) References Cited

U.S. PATENT DOCUMENTS

| | | | | |
|---|---|---|---|---|
| 2006/0044924 A1* | 3/2006 | Wada | ................... | G11C 11/4074 |
| | | | | 365/230.06 |
| 2020/0118636 A1* | 4/2020 | Athreya | ................. | G11C 16/26 |
| 2020/0251158 A1* | 8/2020 | Shore | .................... | G11C 11/408 |
| 2023/0186971 A1* | 6/2023 | Takahashi | ......... | G11C 11/40618 |
| | | | | 365/230.03 |
| 2023/0206980 A1* | 6/2023 | He | .................... | G11C 11/40603 |
| | | | | 365/222 |
| 2023/0206989 A1* | 6/2023 | He | ....................... | G11C 11/4087 |
| | | | | 365/189.02 |
| 2023/0352076 A1* | 11/2023 | He | ................... | G11C 11/40603 |
| 2023/0395123 A1* | 12/2023 | He | ....................... | G11C 11/4085 |
| 2024/0212738 A1* | 6/2024 | Akamatsu | ......... | G11C 11/40622 |
| 2024/0339145 A1* | 10/2024 | Kim | ...................... | G11C 11/408 |
| 2024/0347100 A1* | 10/2024 | He | ....................... | G11C 11/4076 |

FOREIGN PATENT DOCUMENTS

CN           117453121 A  *  1/2024   ......... G11C 11/4078

* cited by examiner

*Primary Examiner* — Jay W. Radke
(74) *Attorney, Agent, or Firm* — Colby Nipper PLLC

(57)     ABSTRACT

Apparatuses and techniques for implementing usage-based disturbance mitigation counter control are described. In some examples, a mitigation counter controller manages mitigation of usage-based disturbances by mitigating one or more wordlines in a memory device that have been disturbed. The mitigation counter controller may access a usage-based disturbance counter by activating a single sub wordline driver in the wordline, where the usage-based disturbance counter is associated with usage-based disturbances of the wordline. Activation of a single sub wordline driver to access the usage-based disturbance counter may reduce power consumption and may simplify the design of the memory device.

20 Claims, 11 Drawing Sheets

100

Apparatus
102

Host Device
104

Processor
110

Cache Memory
112

Memory Controller
114

116 — Interconnect 106

Memory Device
108

Mitigation Counter Controller
118

102-1

IoT 102-2

102-3

102-4

102-5

102-6

102-7

1000

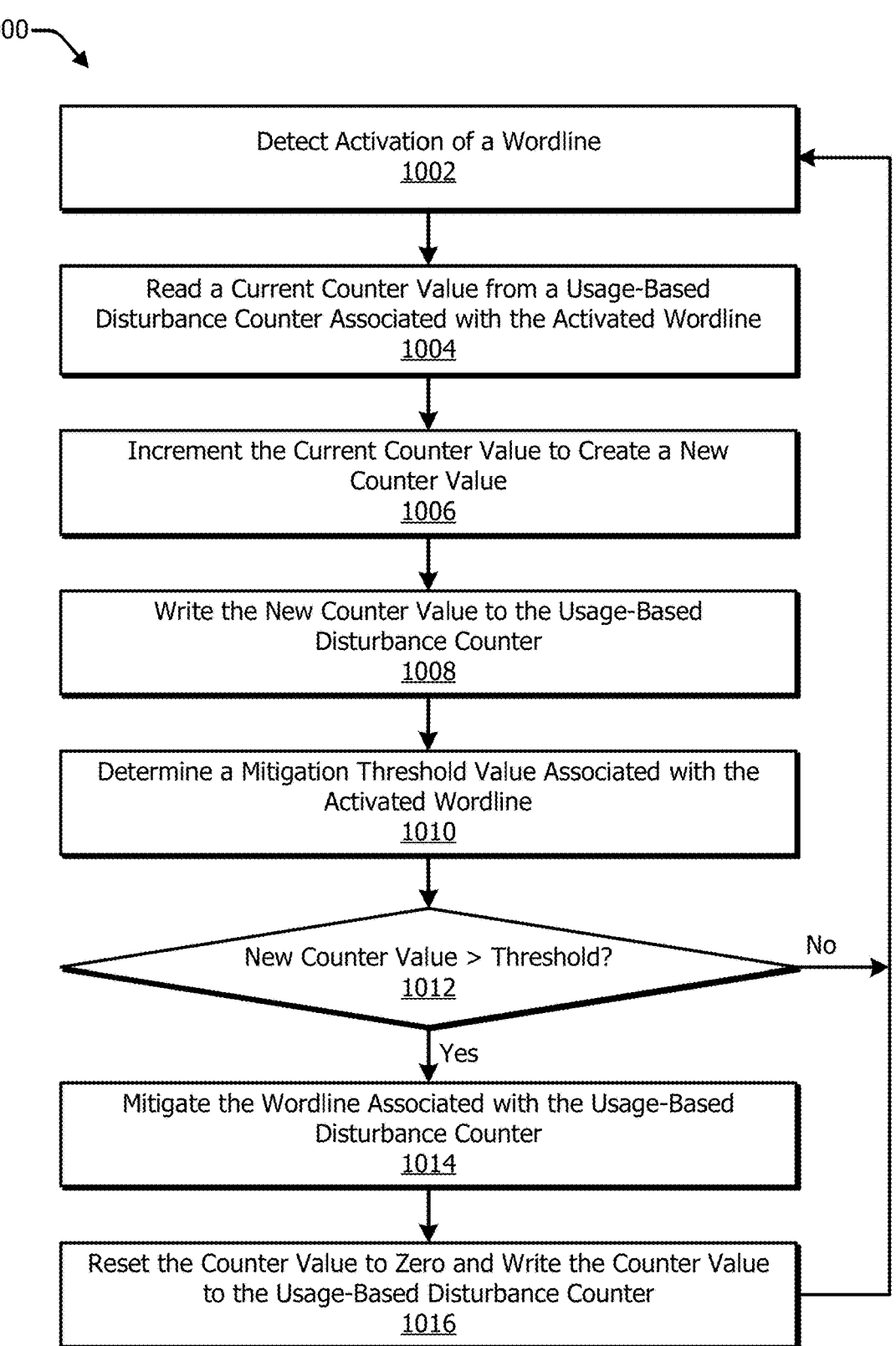

Detect Activation of a Wordline
1002

Read a Current Counter Value from a Usage-Based
Disturbance Counter Associated with the Activated Wordline
1004

Increment the Current Counter Value to Create a New
Counter Value
1006

Write the New Counter Value to the Usage-Based
Disturbance Counter
1008

Determine a Mitigation Threshold Value Associated with the
Activated Wordline
1010

New Counter Value > Threshold?
1012

No

Yes

Mitigate the Wordline Associated with the Usage-Based
Disturbance Counter
1014

Reset the Counter Value to Zero and Write the Counter Value
to the Usage-Based Disturbance Counter
1016

*FIG. 10*

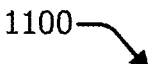

1100

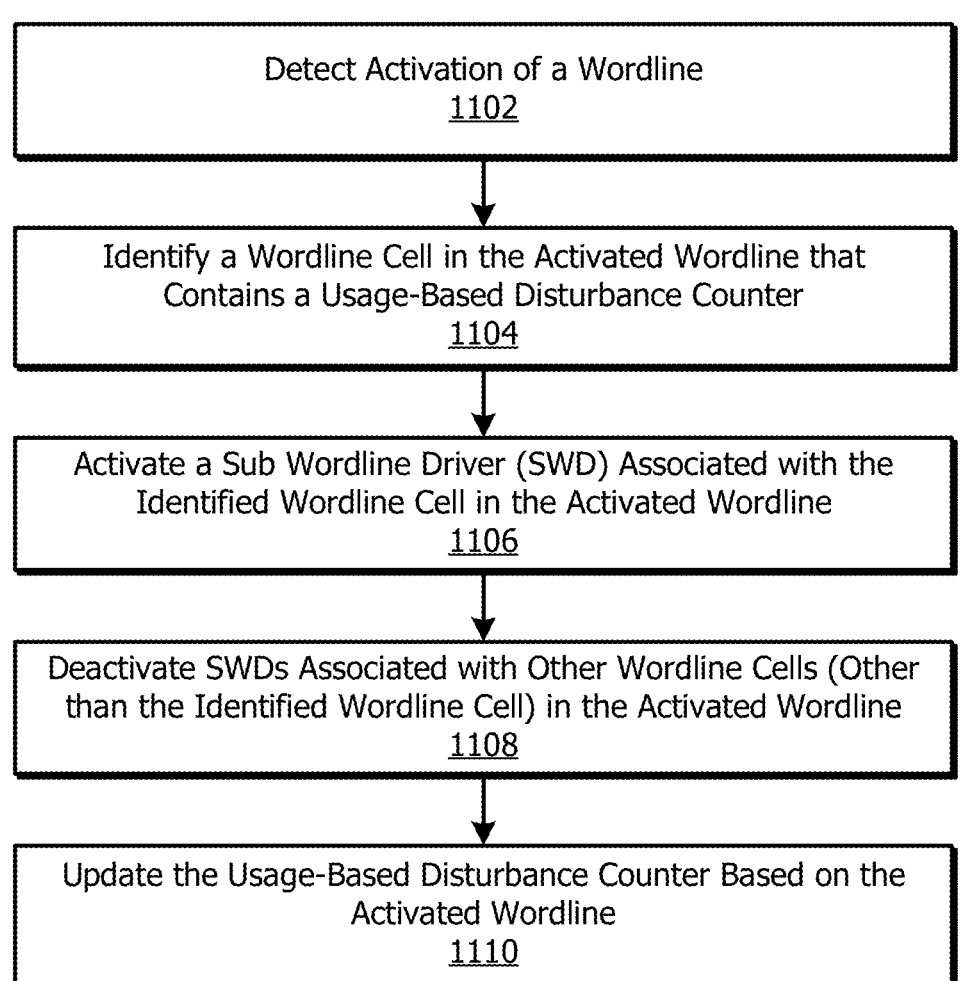

Detect Activation of a Wordline
1102

Identify a Wordline Cell in the Activated Wordline that Contains a Usage-Based Disturbance Counter
1104

Activate a Sub Wordline Driver (SWD) Associated with the Identified Wordline Cell in the Activated Wordline
1106

Deactivate SWDs Associated with Other Wordline Cells (Other than the Identified Wordline Cell) in the Activated Wordline
1108

Update the Usage-Based Disturbance Counter Based on the Activated Wordline
1110

*FIG. 11*

USAGE-BASED DISTURBANCE MITIGATION COUNTER CONTROL

CROSS-REFERENCE TO RELATED APPLICATION(S)

This application claims the benefit of U.S. Provisional Patent Application Ser. No. 63/500,123 filed on May 4, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for implementing usage-based disturbance mitigation counter control are described with reference to the following drawings. The same numbers are used throughout the drawings to reference like features and components:

FIG. 10 illustrates an example method for implementing aspects of usage-based disturbance mitigation counter control; and FIG. 11 illustrates another example method for implementing aspects of usage-based disturbance mitigation counter control.

DETAILED DESCRIPTION

Overview

Figure 1:
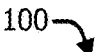
FIG. 1 illustrates example apparatuses that can implement aspects of usage-based disturbance mitigation counter control.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet demands for physically smaller memories, memory devices can be designed with higher chip densities. Increasing chip density, however, can increase the electromagnetic coupling (e.g., capacitive coupling) between adjacent or proximate rows of memory cells due, at least in part, to a shrinking distance between these rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1". In this example, the voltage fluctuation can cause a sense amplifier to incorrectly determine the state of the memory cell to be a "0" instead of a "1". Left unchecked, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in an adjacent row (e.g., within an R+1 row, an R+2 row, an R−1 row, and/or an R−2 row) to change states. This effect is referred to as a usage-based disturbance. The occurrence of usage-based disturbance can lead to corruption or changing of contents within the affected row of memory.

Some memory devices utilize circuits that can detect usage-based disturbance and mitigate its effects. These circuits, however, can add complexity and cost to a memory device. Additionally, these circuits can increase an overall footprint and power consumption of the memory device, which can make it challenging to integrate within space-constrained devices, including portable devices.

To address this and other issues regarding usage-based disturbance, this document describes aspects of usage-based disturbance mitigation counter control. As described herein, a mitigation counter controller manages mitigation of usage-based disturbances by mitigating one or more wordlines in a memory device that have been disturbed. The mitigation counter controller may access a usage-based disturbance counter by activating a single sub wordline driver in the wordline, wherein the usage-based disturbance counter is associated with usage-based disturbances of the wordline. Activation of a single sub wordline driver to access the usage-based disturbance counter may reduce power consumption and may simplify the design of the memory device. Although particular examples of the mitigation counter controller are discussed herein, alternate embodiments may be implemented using any type of controller or other system.

Example Operating Environments

FIG. 1 illustrates, at 100 generally, an example operating environment including an apparatus 102 that can implement usage-based disturbance mitigation counter control. The apparatus 102 can include various types of electronic devices, including an internet-of-things (IoT) device 102-1, tablet device 102-2, smartphone 102-3, notebook computer 102-4, passenger vehicle 102-5, server computer 102-6, or server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, or sensor, or electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory, including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes at least one mitigation counter controller 118.

The mitigation counter controller 118 manages mitigation of usage-based disturbances by mitigating one or more wordlines in a memory device that have been disturbed. The mitigation counter controller 118 may access a usage-based disturbance counter associated with a wordline by activating a single sub wordline driver in the wordline. Activation of the single sub wordline driver to access the usage-based disturbance counter may reduce power consumption and may simplify the design of the memory device 108. For example, activating a single sub wordline driver typically requires less power than activating multiple (or all) sub wordline drivers in a particular wordline. The mitigation counter controller 118 is further described with respect to FIG. 2.

Figure 2:
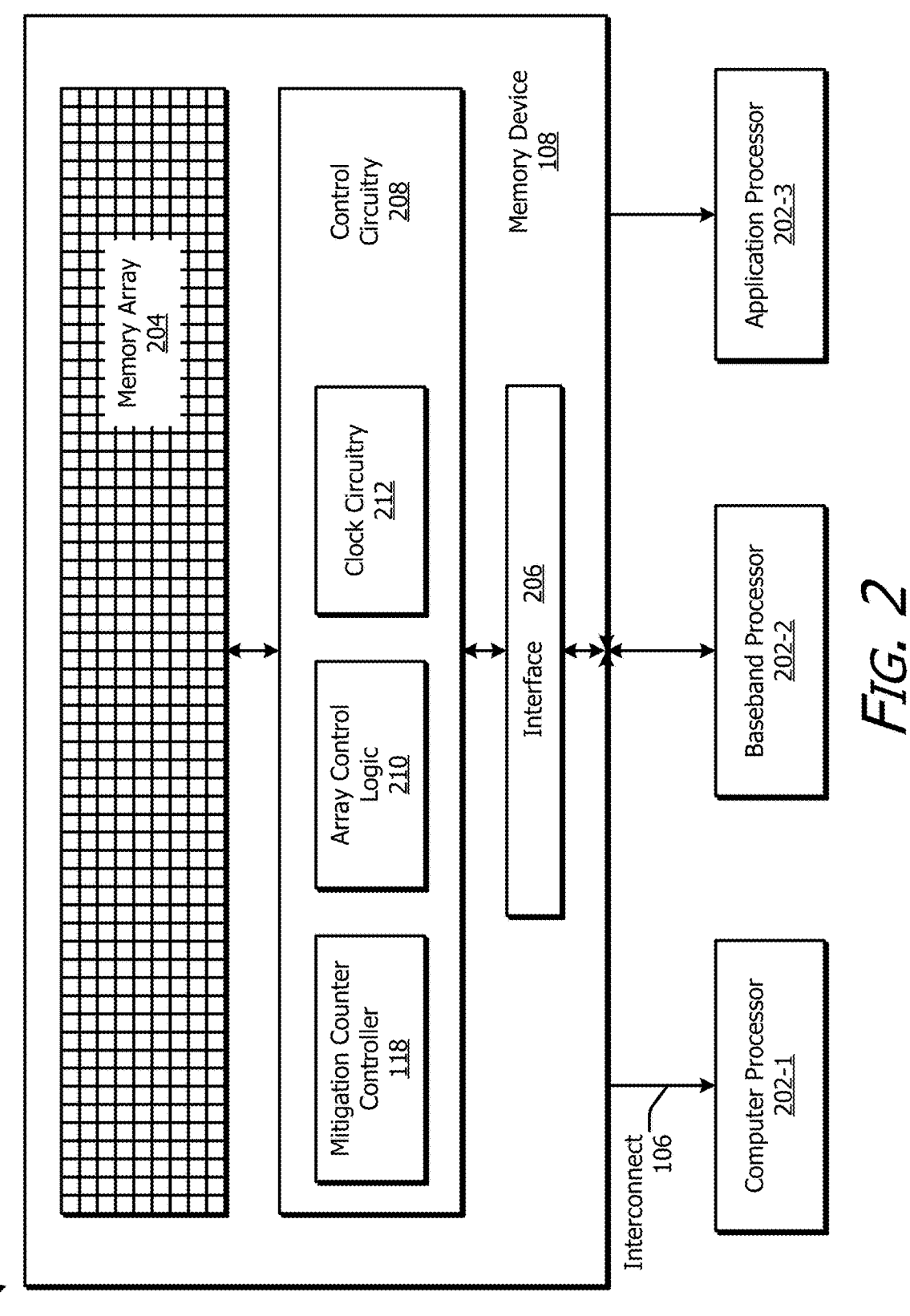
FIG. 2 illustrates an example computing system that can implement aspects of usage-based disturbance mitigation counter control within a memory device.

FIG. 2 illustrates an example computing system 200 as an example of at least a portion of the apparatus 102 that can implement aspects of usage-based disturbance mitigation counter control. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 208 can include at least one instance of array control logic 210, clock circuitry 212, and a mitigation counter controller 118. The array control logic 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality.

The mitigation counter controller 118 manages mitigation of usage-based disturbances by mitigating one or more wordlines in the memory device 108 that have been disturbed. For example, the mitigation counter controller 118 may mitigate a wordline in the memory device 108 that's been a subject of usage-based disturbances based on the value of a usage-based disturbance counter associated with the wordline.

The interface 206 can couple the control circuitry 208 or the memory array 204 directly or indirectly to the interconnect 106. In some implementations, the mitigation counter controller 118, the array control logic 210, and the clock circuitry 212 can be part of a single component (e.g., the control circuitry 208). In other implementations, one or more of the mitigation counter controller 118, the array control logic 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within a same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and be referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices).

Example Techniques and Hardware

Figure 3:
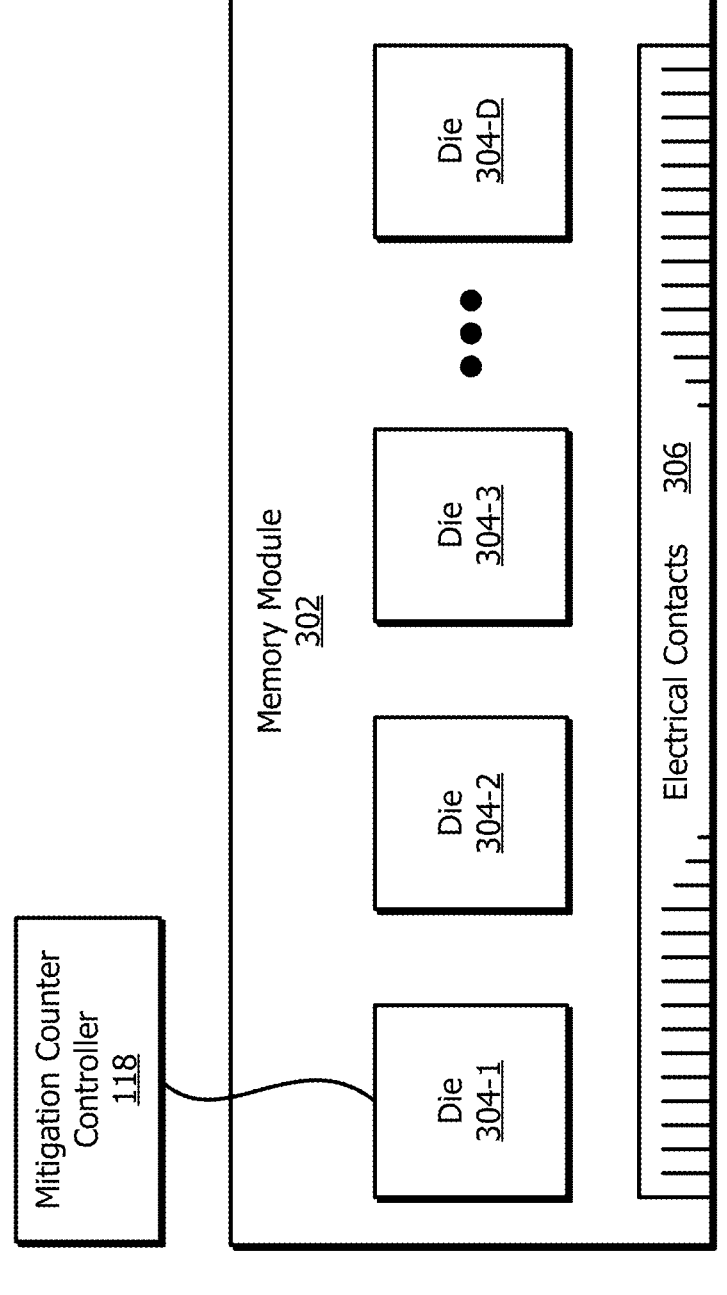
FIG. 3 illustrates an example memory device in which aspects of usage-based disturbance mitigation counter control may be implemented.
Figure 3:
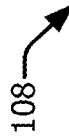

FIG. 3 illustrates an example memory device 108 in which aspects of usage-based disturbance mitigation counter control can be implemented. The memory device 108 includes a memory module 302, which can include multiple dies 304. As illustrated, the memory module 302 includes a first die 304-1, a second die 304-2, a third die 304-3, and a Dth die 304-D, with D representing a positive integer. One or more of the dies 304-1 to 304-D can include the mitigation counter controller 118. The memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to multiple dies (or dice) 304-1 through 304-D, or a memory module 302 with two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. Additional details regarding the mitigation counter controller 118 are further described below.

Figure 4:
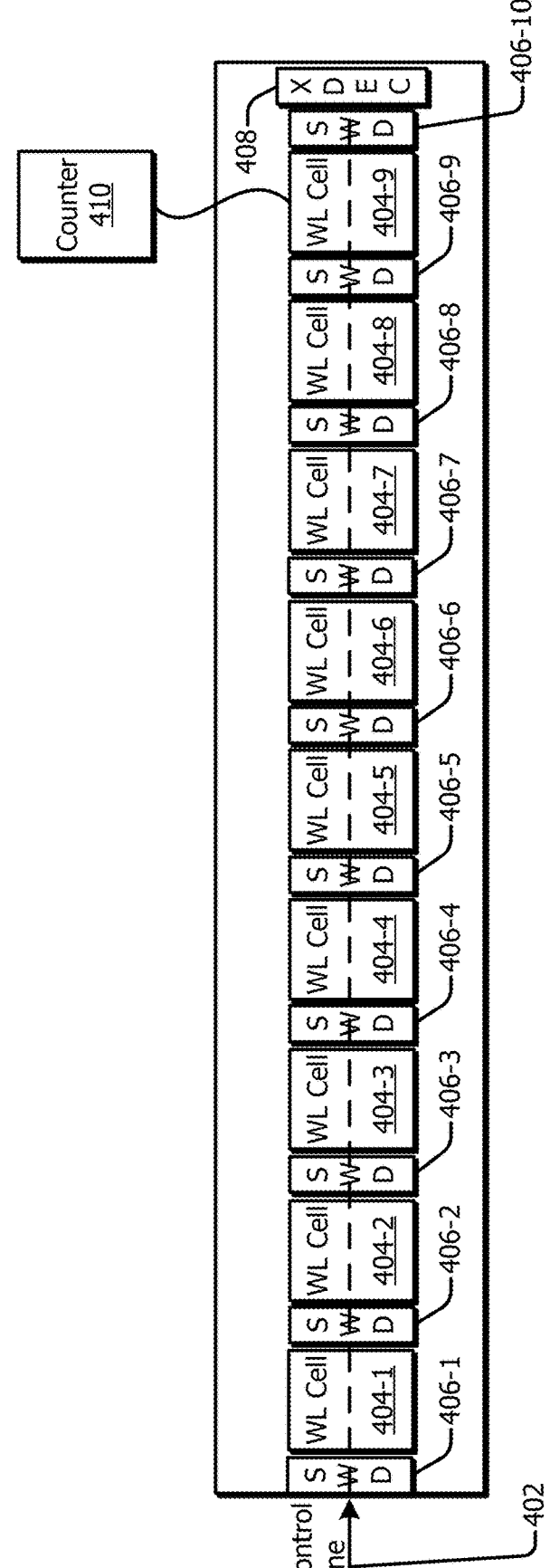
FIG. 4 illustrates an example wordline in a memory device that includes multiple wordline cells.

FIG. 4 illustrates an example wordline 400 in a memory device (or memory array) that includes multiple wordline cells 404. The wordline cells 404 may also be referred to as memory cells. As shown in FIG. 4, the wordline 400 includes a control line illustrated by a broken line 402 that runs through wordline cells 404-1 to 404-9. The example of FIG. 4 also illustrates multiple sub wordline drivers (SWDs) 406-1 to 406-10. In the configuration of FIG. 4, each wordline cell 404 has one SWD 406 on opposite sides of the cell 404. In some implementations, each SWD 406 is connected to adjacent wordline cells 404. The SWD 406 is described in greater detail herein.

The wordline 400 also includes a row decoder (XDEC) 408 and a usage-based disturbance counter 410. In the example of FIG. 4, the usage-based disturbance counter 410 is located in the wordline cell 404-9. In some embodiments, the usage-based disturbance counter 410 stores any number of counter bits that represent a current counter value.

Although the usage-based disturbance counter 410 can be located in any wordline cell 404, it may be advantageous to position the usage-based disturbance counter 410 close to a main wordline driver (not shown) to reduce a routing distance from the main wordline driver to the usage-based disturbance counter 410. The shorter routing distance reduces a communication distance between the main wordline driver and the usage-based disturbance counter 410. In some embodiments, the main wordline driver is located adjacent to or proximate the XDEC 408.

In many situations, usage-base disturbances occur across the entire wordline 400. Thus, the usage-based disturbance counter 410 can be positioned in any wordline cell 404. Only one usage-based disturbance counter 410 is needed for each wordline 400 because the one usage-based disturbance counter 410 will detect and count any usage-based disturbance of the wordline 400. Similarly, when the wordline 400 needs to be mitigated (based on the value of the usage-based disturbance counter 410), the entire wordline 400 is mitigated (e.g., cleared) and the value of the usage-based disturbance counter 410 is reset to zero. Mitigation of the wordline 400 and operation of the usage-based disturbance counter 410 are discussed in greater detail herein.

Figure 5:
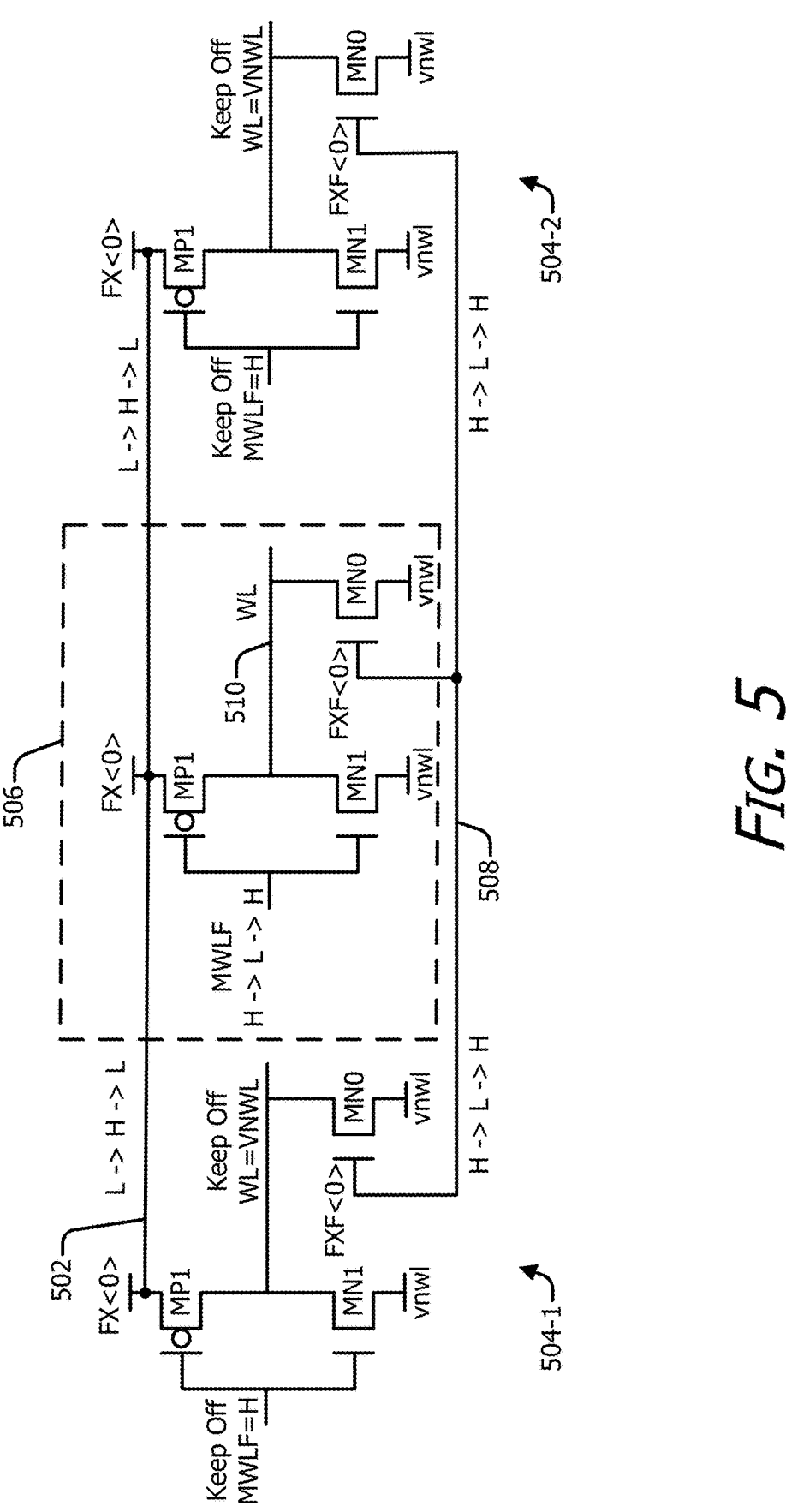
FIG. 5 illustrates an example circuit with three sub wordline drivers associated with a particular wordline.

FIG. 5 illustrates an example circuit 500 with three SWDs associated with a particular wordline. As shown in example circuit 500, an independent SWD 506 is identified by broken lines surrounding the independent SWD 506. In some embodiments, the independent SWD 506 operates with a wordline cell that is associated with (e.g. comprises) the usage-based disturbance counter 410 discussed above with respect to FIG. 4. Two other SWDs 504-1 and 504-2 operate with wordline cells that are not associated with (e.g. do not comprise) the usage-based disturbance counter 410. In some embodiments, the independent SWD 506 can be activated to manage the operations of the usage-based disturbance counter 410 while the other two SWDs 504-1 and 504-2 may be off (e.g., deactivated).

The example circuit 500 illustrates an embodiment of a circuit to activate the independent SWD 506 while the other two SWDs 504-1 and 504-2 are not activated. An FX (Factor X) line 502 represents a row access factor for a particular row of wordline cells. An FXF (inverse state of FX) line 508 represents a state that is the inverse of the state associated with the FX line 502. In the example circuit 500, the FX line 502 may transition from low to high to low (L->H->L). The FXF line 508 is the inverse of the FX line 502, so the FXF line 508 transitions from high to low to high (H->L->H).

As shown in FIG. 5, each of the three SWDs 504-1, 504-2, and 506 have one PMOS transistor (MP1) and two NMOS transistors (MN0 and MN1). However, signals applied to transistors MP1 and MN1 differ between the independent SWD 506 that is activated and the other two SWDs 504-1 and 504-2 that are deactivated. For example, the SWDs 504-1 and 504-2 are maintained in an off state (e.g., deactivated) by applying MWLF=H to MP1 and MN1. MWLF is the Main Wordline F, which is the inverse state of MWL. Additionally WL=VNWL (Volt Negative Wordline) is applied to MN0 as shown in the example of FIG. 5.

In contrast to the SWDs 504-1 and 504-2, the independent SWD 506 is activated by cycling MWLF applied to MP1 and MN1 from high to low to high (H->L->H). This cycling causes counter bits WL 510 of counter 410 to toggle. Thus, the example of FIG. 5 provides separate control of the usage-based disturbance counter 410 bits from the normal bits by using MWLF. During reset of the usage-based disturbance counter 410 bits, the normal MWLF is kept off (deactivated) by applying "H". MWLF is activated (on) from H to L to access the usage-based disturbance counter 410 bits.

Figure 6:
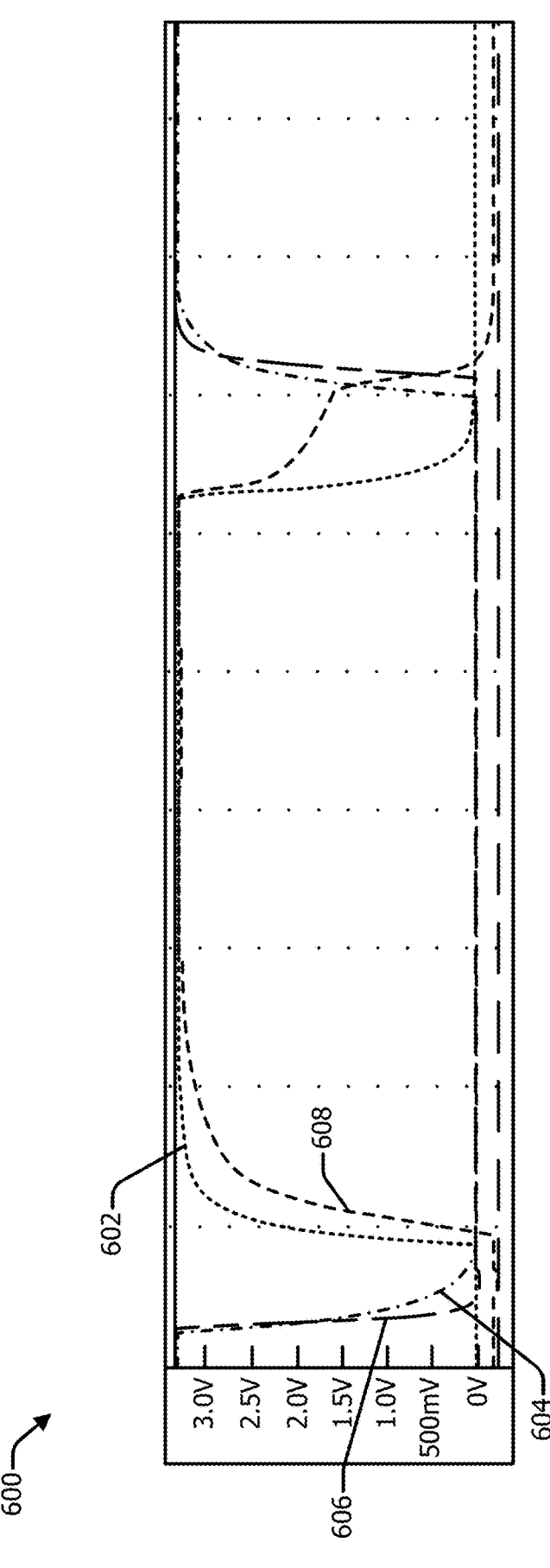
FIG. 6 illustrates a graph representing some of the signals associated with the example circuit of FIG. 5.

FIG. 6 illustrates a graph 600 representing some of the signals associated with the example circuit 500 of FIG. 5. In the example of FIG. 6, a WL signal changes from off to on, then from on to off. For example, a signal line 602 represents the FX line (represented in FIG. 5 as 502). A signal line 604 represents the FXF line (represented in FIG. 5 as 508). A signal line 606 represents the MWLF line discussed above with respect to FIG. 5. A signal line 608 represents the WL line (represented in FIG. 5 as 510). As noted in FIG. 6, the WL on a left side of each SWD 504-1 and 504-2 is kept off with MLWF=H. Additionally, the WL on a right side of each SWD 504-1 and 504-2 is kept off with WL=VNWL.

Figure 7:
FIG. 7 illustrates an example circuit with three sub wordline drivers associated with a particular wordline.

FIG. 7 illustrates an example circuit 700 with three SWDs associated with a particular wordline. The example circuit 700 is similar to the example circuit 500 discussed above, but the example circuit 700 independently controls one of the SWDs by keeping FX low and keeping FXF high. For example, as shown in the example circuit 700, an independent SWD 706 is identified by broken lines surrounding the independent SWD 706. In some embodiments, the independent SWD 706 operates with a wordline cell that is associated with the usage-based disturbance counter 410 discussed above with respect to FIG. 4. Two other SWDs 704-1 and 704-2 operate with wordline cells that are not associated with the usage-based disturbance counter 410 (e.g. their outputs are not directly coupled to a memory cell that comprises the counter 410). In some embodiments, the independent SWD 706 can be activated to manage the operations of the usage-based disturbance counter 410 while the other two SWDs 704-1 and 704-2 may be off (e.g., deactivated).

The example circuit 700 illustrates an embodiment of a circuit to activate the independent SWD 706 while the other two SWDs 704-1 and 704-2 are not activated. An FX (Factor X) line 702 represents a row access factor for a particular row of wordline cells. An FXF (inverse state of FX) line 708 represents a state that is the inverse of a state associated with the FX line 702. In the example circuit 700, the FX line 702 may be kept low. The FXF line 708 is the inverse of the FX line 702, so the FXF line 708 may be kept high.

As shown in FIG. 7, each of the three SWDs 704-1, 704-2, and 706 have one PMOS transistor (MP1) and two NMOS transistors (MN0 and MN1). However, signals applied to transistors MP1 and MN1 differ between the independent SWD 706 that is activated and the other two SWDs 704-1 and 704-2 that are deactivated. For example, the SWDs 704-1 and 704-2 are maintained in the off state (e.g., deactivated) by keeping the FX line 702 low and the FXF line 708 high. As shown in FIG. 7, MWLF is cycled from high to low to high (H->L->H). Additionally WL=VNWL (Volt Negative Wordline) is applied to MN0 as shown in the example of FIG. 7.

In contrast to the SWDs 704-1 and 704-2, the independent SWD 706 is activated by cycling the FX signal applied to MP1 and cycling the FXF signal applied to MN0. In some embodiments, the FX signal applied to MP1 and the FXF signal applied to MN0 are cycled from low to high to low (L->H->L). This cycling causes counter bits WL 710 to toggle. Thus, the example of FIG. 7 provides separate control of the usage-based disturbance counter 410 bits from the normal bits by using FX/FXF. During reset of the usage-based disturbance counter 410 bits, FX/FXF are kept off at L/H. FX/FXF for the usage-based disturbance counter 410 bits are activated (on) from L to H (and H to L) to access the usage-based disturbance counter 410 bits.

Figure 8:
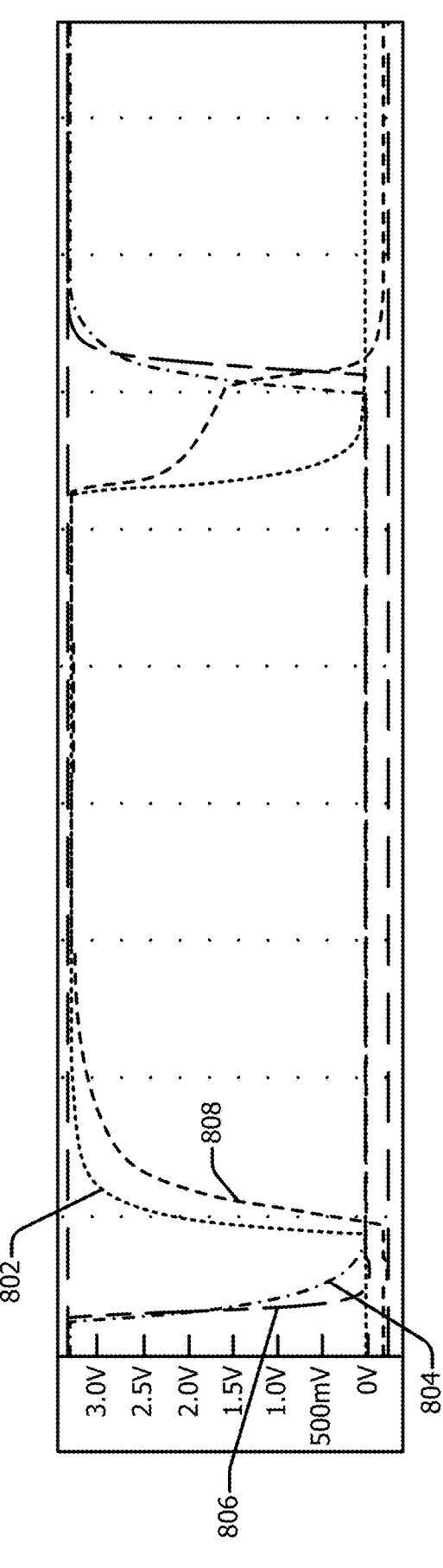
FIG. 8 illustrates a graph representing some of the signals associated with the example circuit of FIG. 7.

FIG. 8 illustrates a graph 800 representing some of the signals associated with the example circuit 700 of FIG. 7. In the example of FIG. 8, an FX line is kept low while an FXF line is kept high. For example, a signal line 802 represents the FX line (represented in FIG. 7 as 702). A signal line 804 represents the FXF line (represented in FIG. 7 as 708). A signal line 806 represents the MWLF line discussed above with respect to FIGS. 5 and 7. A signal line 808 represents the WL line (represented in FIG. 5 as 710). As noted in FIG. 8, the FXF line 804 is kept high and the FX line 802 is kept low to maintain the independent SWD 706 in an activated state and maintain the other two SWDs 704-1 and 704-2 in a deactivated state.

Figure 9:
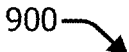
FIG. 9 illustrates an example portion of a wordline in a memory device that includes multiple wordline cells.
Figure 9:
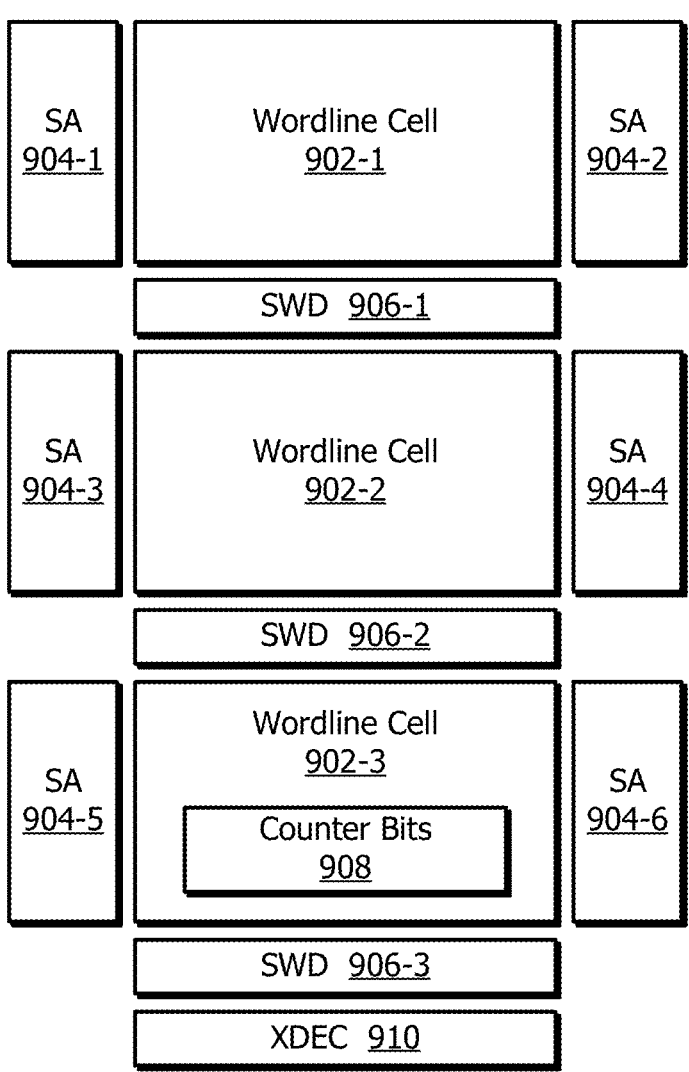

FIG. 9 illustrates an example portion 900 of a wordline in a memory device that includes multiple wordline cells. As shown in FIG. 9, three wordline cells 902-1, 902-2, and 902-3 are illustrated as a portion 900 of a wordline. The complete wordline may include any number of wordline cells 902. Each wordline cell 902 has a sense amplifier (SA) 904 on opposite sides of the wordline cell 902. For example, the wordline cell 902-1 has associated SAs 904-1 and 904-2, the wordline cell 902-2 has associated SAs 904-3 and 904-4, and, the wordline cell 902-3 has associated SAs 904-5 and 904-6. Additionally, SWDs 906-1 and 906-2 are positioned between wordline cells 902. An SWD 906-3 is positioned between the wordline cell 902-3 and a row decoder 910.

One of the wordline cells (902-3) includes counter bits 908, such as data bits managed by the usage-based disturbance counter 410 discussed herein. In some embodiments, when usage-based disturbance counter activities are being performed (e.g., updating the counter value), only the wordline cell 902-3 needs to be activated. In this situation, the wordline cells 902-1 and 902-2 can be deactivated. To save power, the SAs 904-1, 904-2, 904-3, and 904-4 can be deactivated. For example, power savings may result by not requiring digital line/cell charging of the SAs 904-1, 904-2, 904-3, and 904-4.

The SAs 904-5 and 904-6 remain activated to support the operation of the wordline cell 902-3. This deactivation of certain SAs 904 may be used in combination with or instead of the deactivation of SWDs 406 discussed herein.

Example Method

This section describes example methods for implementing sharable usage-based disturbance circuitry with reference to the flow diagrams of FIGS. 10 and 11. These descriptions may also refer to components, entities, and other aspects depicted in FIGS. 1 to 9 by way of example only. The described methods are not necessarily limited to performance by one entity or multiple entities operating on one device.

FIG. 10 illustrates an example method 1000 for implementing aspects of usage-based disturbance mitigation counter control. In some embodiments, operations of the method 1000 are implemented by or with the mitigation counter controller 118 as described with reference to FIGS. 1 to 9. At 1002, activation of a wordline is detected. For example, the mitigation counter controller 118 or other system may detect the wordline activation.

At 1004, the method 1000 reads a current counter value from a usage-based disturbance counter associated with the activated wordline (e.g., the wordline detected at 1002). For example, the current counter value may be read by the mitigation counter controller 118 or other system. In some embodiments, the current counter value is represented by the usage-based disturbance counter 410. As discussed herein, the current counter value may be read from a wordline cell in the activated wordline. In some embodiments, the counter value may be reset to zero at power up of a memory device to ensure that the counter value starts at a value of zero.

At 1006, the current counter value is incremented in response to detecting the wordline activation to create a new counter value. For example, the mitigation counter controller 118 may increment the usage-based disturbance counter 410.

At 1008, the new counter value is written to the usage-based disturbance counter 410. For example, the mitigation counter controller 118 may control the writing of the new counter value to the usage-based disturbance counter 410.

At 1010, the method 1000 determines a mitigation threshold value associated with the activated wordline. For example, the mitigation threshold value may identify a number of usage-based disturbances of a wordline that triggers a mitigation activity (e.g., clearing one or more wordlines affected by the usage-based disturbances). The mitigation counter controller 118 may determine the mitigation threshold value associated with the activated wordline. The mitigation threshold value may be determined by a designer, an administrator, or another user/system based on various factors, such as a risk of usage-based disturbances to one or more systems using the memory devices discussed herein. Example mitigation threshold values may range from 100-25,000.

At 1012, the method 1000 determines whether the new counter value exceeds the mitigation threshold value determined at 1010. For example, the mitigation counter controller 118 may compare the new counter value to the mitigation threshold value to determine whether a mitigation activity should be initiated. If the new counter value does not exceed the mitigation threshold value, the method 1000 returns to 1002 and detects a next activation of the wordline. If the new counter value exceeds the mitigation threshold value, the method 1000 continues to 1014.

At 1014, the method 1000 mitigates the wordline associated with the usage-based disturbance counter 410. For example, the mitigation counter controller 118 may initiate the mitigation of the wordline and one or more adjacent or nearby wordlines that are also affected by the usage-based disturbances.

At 1016, the counter value is reset to zero and the updated counter value is written to the usage-based disturbance counter 410. For example, the updated counter value in the usage-based disturbance counter 410 will begin incrementing from zero in response to future wordline activations.

FIG. 11 illustrates another example method 1100 for implementing aspects of usage-based disturbance mitigation counter control. In some embodiments, operations of the method 1100 are implemented by or with the mitigation counter controller 118 as described with reference to FIGS. 1 to 9. At 1102, activation of a wordline is detected. For example, the mitigation counter controller 118 or other system may detect the wordline activation.

At 1104, the method 1100 identifies a wordline cell in the activated wordline that contains a usage-based disturbance counter, such as the usage-based disturbance counter 410 discussed herein.

At 1106, the method 1100 activates a SWD associated with the identified wordline cell in the activated wordline. For example, the mitigation counter controller 118 may control activation of the SWD associated with the identified wordline cell.

At 1108, the method 1100 deactivates SWDs associated with other wordline cells (other than the identified wordline cell) in the activated wordline. For example, the mitigation counter controller 118 may control deactivation of the SWDs associated with the other wordline cells.

At 1110, the method 1100 updates the usage-based disturbance counter based on the activated wordline. For example, the mitigation counter controller 118 may control updating the usage-based disturbance counter 410.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 9, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media, including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

In the following, various examples for implementing aspects of usage-based disturbance mitigation counter control are described:

Example 1: An apparatus comprising:

a memory device comprising:

a memory array comprising a plurality of wordlines such that each wordline includes a plurality of memory cells;

a usage-based disturbance counter associated with a first memory cell in a first wordline of the memory array, the usage-based disturbance counter configured to count a number of activations of the first wordline; and a mitigation counter controller associated with the first wordline and configured to:

determine a current value of the usage-based disturbance counter;

determine a mitigation threshold value associated with the first wordline;

compare the current value of the usage-based distur-
bance counter to the mitigation threshold value;
and initiate a usage-based disturbance mitigation of the
first wordline responsive to a result of the com-
parison that indicates the current value of the
usage-based disturbance counter exceeds the miti-
gation threshold value.

Example 2: The apparatus of example 1 or any other
example, wherein the usage-based disturbance counter
is incremented responsive to each activation of the first
wordline.

Example 3: The apparatus of example 1 or any other
example, wherein determining a current value of the
usage-based disturbance counter includes reading the
current value from the first memory cell in the first
wordline.

Example 4: The apparatus of example 1 or any other
example, wherein the first wordline includes a plurality
of sub wordline drivers (SWDs), and wherein the
mitigation counter controller is further configured to
activate a first SWD associated with the first memory
cell in the first wordline.

Example 5: The apparatus of example 4 or any other
example, wherein the mitigation counter controller is
further configured to deactivate all of the plurality of
SWDs in the first wordline except the first SWD.

Example 6: The apparatus of example 1 or any other
example, wherein initiating the usage-based distur-
bance mitigation of the first wordline includes clearing
the plurality of memory cells in the first wordline.

Example 7: The apparatus of example 1 or any other
example, wherein initiating the usage-based distur-
bance mitigation of the first wordline includes resetting
the usage-based disturbance counter to zero.

Example 8: The apparatus of example 1 or any other
example, wherein the first wordline has a plurality of
sense amplifiers (SAs) on each side, wherein the miti-
gation counter controller is further configured to acti-
vate at least one SA associated with the first memory
cell in the first wordline.

Example 9: The apparatus of example 8 or any other
example, wherein the mitigation counter controller is
further configured to deactivate SAs associated with all
of the plurality of memory cells in the first wordline
except the first memory cell.

Example 10: A method comprising:

determining, by a mitigation counter controller, a current
value of a usage-based disturbance counter associated
with a first memory cell in a first wordline of a memory
device;

determining, by the mitigation counter controller, a miti-
gation threshold value associated with the first word-
line;

comparing, by the mitigation counter controller, the cur-
rent value of the usage-based disturbance counter to the
mitigation threshold value associated with the first
wordline; and initiating a usage-based disturbance of the first wordline
responsive to a result of the comparison that indicates
the current value of the usage-based disturbance coun-
ter exceeds the mitigation threshold value associated
with the first wordline.

Example 11: The method of example 10 or any other
example, further comprising detecting activation of the
first wordline prior to determining the current value of
the usage-based disturbance counter.

Example 12: The method of example 10 or any other
example, further comprising activating a first sub word-
line driver (SWD) associated with the first memory cell
in the first wordline.

Example 13: The method of example 12 or any other
example, further comprising deactivating a plurality of
other SWDs associated with the first wordline but not
associated with the first memory cell.

Example 14: The method of example 10 or any other
example, further comprising at least one sense ampli-
fier (SA) associated with the first memory cell in the
first wordline.

Example 15: The method of example 14 or any other
example, further comprising deactivating a plurality of
other SAs associated with the first wordline but not
associated with the first memory cell.

Example 16: An apparatus comprising:

a memory device comprising:

a memory array comprising a plurality of wordlines
such that each wordline includes a plurality of
memory cells and each wordline includes a plurality
of sub wordline drivers (SWDs);

a usage-based disturbance counter associated with a
first memory cell in a first wordline of the memory
array, the usage-based disturbance counter config-
ured to count a number of activations of the first
wordline; and a mitigation counter controller associated with the first
wordline and configured to:

activate a first SWD associated with the first memory
cell in the first wordline;

deactivate all of the plurality of SWDs in the first
wordline except the first SWD;

determine a current value of the usage-based distur-
bance counter;

compare the current value of the usage-based distur-
bance counter to a mitigation threshold value; and initiate a usage-based disturbance mitigation of the
first wordline responsive to a result of the com-
parison that indicates the current value of the
usage-based disturbance counter exceeds the miti-
gation threshold value.

Example 17: The apparatus of example 16 or any other
example, wherein the usage-based disturbance counter
is incremented responsive to each activation of the first
wordline.

Example 18: The apparatus of example 16 or any other
example, wherein determining a current value of the
usage-based disturbance counter includes reading the
current value from the first memory cell in the first
wordline.

Example 19: The apparatus of example 16 or any other
example, wherein the first wordline has a plurality of
sense amplifiers (SAs) on each side, wherein the miti-
gation counter controller is further configured to acti-
vate at least one SA associated with the first memory
cell in the first wordline.

Example 20: The apparatus of example 19 or any other
example, wherein the mitigation counter controller is
further configured to deactivate SAs associated with all
of the plurality of memory cells in the first wordline
except the first memory cell.

Conclusion

Although aspects of implementing usage-based distur-
bance mitigation counter control have been described in language specific to certain features and/or methods, the subject of the appended claims is not necessarily limited to the specific features or methods described. Rather, the specific features and methods are disclosed as a variety of example implementations of implementing usage-based disturbance mitigation counter control.

What is claimed is:

1. An apparatus comprising:
a memory device comprising:
  a memory array comprising a plurality of wordlines such that each wordline includes:
    a plurality of memory cells; and
    a plurality of sub wordline drivers (SWDs);
  a usage-based disturbance counter associated with a first memory cell in a first wordline of the memory array, the usage-based disturbance counter configured to count a number of activations of the first wordline; and
  a mitigation counter controller associated with the first wordline and configured to:
    identify the first memory cell in the first wordline as containing the usage-based disturbance counter;
    activate, in response to identifying the first memory cell in the first wordline as containing the usage-based disturbance counter, a first SWD of the plurality of SWDs, the first SWD associated with the first memory cell in the first wordline, the activation effective to access the usage-based disturbance counter;
    determine a current value of the usage-based disturbance counter;
    determine a mitigation threshold value associated with the first wordline;
    compare the current value of the usage-based disturbance counter to the mitigation threshold value; and
    initiate a usage-based disturbance mitigation of the first wordline responsive to a result of the comparison that indicates the current value of the usage-based disturbance counter exceeds the mitigation threshold value.

2. The apparatus of claim 1, wherein the usage-based disturbance counter is incremented responsive to each activation of the first wordline.

3. The apparatus of claim 1, wherein determining a current value of the usage-based disturbance counter includes reading the current value from the first memory cell in the first wordline.

4. The apparatus of claim 1, wherein the mitigation counter controller is further configured to deactivate all of the plurality of SWDs in the first wordline except the first SWD.

5. The apparatus of claim 1, wherein initiating the usage-based disturbance mitigation of the first wordline includes mitigating the plurality of memory cells in the first wordline.

6. The apparatus of claim 1, wherein initiating the usage-based disturbance mitigation of the first wordline includes resetting the usage-based disturbance counter to zero.

7. The apparatus of claim 1, wherein the first wordline has a plurality of sense amplifiers (SAs) on each side, wherein the mitigation counter controller is further configured to activate at least one SA associated with the first memory cell in the first wordline.

8. The apparatus of claim 7, wherein the mitigation counter controller is further configured to deactivate SAs associated with all of the plurality of memory cells in the first wordline except the first memory cell.

9. A method comprising:
identifying, by a mitigation counter controller, a first memory cell in a first wordline of a memory device as containing a usage-based disturbance counter;
activating, by the mitigation counter controller and in response to the identifying the first memory cell in the first wordline of the memory device as containing the usage-based disturbance counter, a first sub wordline driver (SWD) associated with the first memory cell in the first wordline of the memory device, the activating effective to access the usage-based disturbance counter;
determining, by the mitigation counter controller, a current value of the usage-based disturbance counter associated with the first memory cell in the first wordline of the memory device;
determining, by the mitigation counter controller, a mitigation threshold value associated with the first wordline;
comparing, by the mitigation counter controller, the current value of the usage-based disturbance counter to the mitigation threshold value associated with the first wordline; and
initiating a usage-based disturbance of the first wordline responsive to the comparison that the current value of the usage-based disturbance counter exceeds the mitigation threshold value associated with the first wordline.

10. The method of claim 9, further comprising detecting activation of the first wordline prior to determining the current value of the usage-based disturbance counter.

11. The method of claim 9, further comprising deactivating a plurality of other SWDs associated with the first wordline but not associated with the first memory cell.

12. The method of claim 9, further comprising at least one sense amplifier (SA) associated with the first memory cell in the first wordline.

13. The method of claim 12, further comprising deactivating a plurality of other SAs associated with the first wordline but not associated with the first memory cell.

14. The method of claim 9, wherein the usage-based disturbance counter is configured to detect an activation of the first wordline and increment in response to the detected activation of the first wordline.

15. The method of claim 14, wherein the activation of the first wordline is in response to electromagnetic coupling between the first wordline and at least one of a plurality of wordlines that are adjacent or proximate to the first wordline.

16. An apparatus comprising:
a memory device comprising:
  a memory array comprising a plurality of wordlines such that each wordline includes:
    a plurality of memory cells; and
    a plurality of sub wordline drivers (SWDs);
  a usage-based disturbance counter associated with a first memory cell in a first wordline of the memory array, the usage-based disturbance counter configured to count a number of activations of the first wordline; and
  a mitigation counter controller associated with the first wordline and configured to:
    identify the first memory cell in the first wordline as containing the usage-based disturbance counter;
    activate, in response to identifying the first memory cell in the first wordline as containing the usage-based disturbance counter, a first SWD associated with the first memory cell in the first wordline, the activation effective to access the usage-based disturbance counter;

deactivate all of the plurality of SWDs in the first wordline except the first SWD;

determine a current value of the usage-based disturbance counter;

compare the current value of the usage-based disturbance counter to a mitigation threshold value; and initiate a usage-based disturbance mitigation of the first wordline responsive to a result of the comparison that indicates the current value of the usage-based disturbance counter exceeds the mitigation threshold value.

17. The apparatus of claim 16, wherein the usage-based disturbance counter is incremented responsive to each activation of the first wordline.

18. The apparatus of claim 16, wherein determining a current value of the usage-based disturbance counter includes reading the current value from the first memory cell in the first wordline.

19. The apparatus of claim 16, wherein the first wordline has a plurality of sense amplifiers (SAs), wherein the mitigation counter controller is further configured to activate at least one SA associated with the first memory cell in the first wordline.

20. The apparatus of claim 19, wherein the mitigation counter controller is further configured to deactivate SAs associated with all of the plurality of memory cells in the first wordline except the first memory cell.

\* \* \* \* \*